United States Patent
Sun et al.

(10) Patent No.: US 11,342,407 B2
(45) Date of Patent: May 24, 2022

(54) OLED DISPLAY SUBSTRATE AND DISPLAY PANEL

(71) Applicant: BOE TECHNOLOGY GROUP CO., LTD., Beijing (CN)

(72) Inventors: Zhongyuan Sun, Beijing (CN); Weijie Wang, Beijing (CN); Jinxiang Xue, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 118 days.

(21) Appl. No.: 16/966,796

(22) PCT Filed: Nov. 21, 2019

(86) PCT No.: PCT/CN2019/119919
§ 371 (c)(1),
(2) Date: Jul. 31, 2020

(87) PCT Pub. No.: WO2020/103900
PCT Pub. Date: May 28, 2020

(65) Prior Publication Data
US 2021/0043713 A1    Feb. 11, 2021

(30) Foreign Application Priority Data
Nov. 22, 2018    (CN) .......................... 201811398515.6

(51) Int. Cl.
*H01L 27/32*    (2006.01)
*H01L 51/00*    (2006.01)
*H01L 51/52*    (2006.01)

(52) U.S. Cl.
CPC ...... *H01L 27/3276* (2013.01); *H01L 51/0097* (2013.01); *H01L 51/5253* (2013.01); *H01L 2251/5338* (2013.01)

(58) Field of Classification Search
CPC ............ H01L 27/3218; H01L 27/3276; H01L 27/3246; H01L 27/3258; H01L 51/5221;
(Continued)

(56) References Cited

U.S. PATENT DOCUMENTS

2016/0268352 A1*  9/2016  Hong .................. H01L 27/3218
2016/0293571 A1* 10/2016  Yoon .................... H01L 27/3276
(Continued)

FOREIGN PATENT DOCUMENTS

CN      202067837 U    12/2011
CN      103745986 A     4/2014
(Continued)

OTHER PUBLICATIONS

Office Action dated Apr. 28, 2020 issued in corresponding Chinese Application No. 201811398515.6.

*Primary Examiner* — Vongsavanh Sengdara
(74) *Attorney, Agent, or Firm* — Nath, Goldberg & Meyer; Joshua B. Goldberg

(57) ABSTRACT

An OLED display substrate and a display panel are provided. The OLED display substrate includes: plural display regions and a spacer region separating the plural display regions from each other, each display region having plural pixel units disposed therein, and each pixel unit including plural OLED devices respectively emitting light of different colors; a first cathode connection line and an insulating layer disposed in at least one display region and sequentially disposed between a base substrate and the plural OLED devices, cathodes of all OLED devices located in a same display region having a one-piece structure; a via hole arranged in the insulating layer, the cathodes of all OLED devices located in the same display region being connected to the first cathode connection line through the via hole; and
(Continued)

a second cathode connection line disposed in the spacer region and connected to the first cathode connection line.

20 Claims, 3 Drawing Sheets

(58) Field of Classification Search
CPC ............. H01L 51/5253; H01L 51/0097; H01L 51/5228
See application file for complete search history.

(56) References Cited

U.S. PATENT DOCUMENTS

| | | | |
|---|---|---|---|
| 2017/0005077 A1* | 1/2017 | Kim | G02B 6/0068 |
| 2017/0117349 A1 | 4/2017 | Jeon et al. | |
| 2017/0278920 A1* | 9/2017 | Park | H01L 27/3293 |
| 2017/0308196 A1 | 10/2017 | Jeong et al. | |
| 2018/0046221 A1* | 2/2018 | Choi | G02B 26/0825 |
| 2018/0114825 A1* | 4/2018 | Hong | H01L 27/326 |
| 2019/0081240 A1* | 3/2019 | Wei | C23C 14/042 |
| 2019/0296097 A1* | 9/2019 | Hong | H01L 27/3216 |

FOREIGN PATENT DOCUMENTS

| | | |
|---|---|---|
| CN | 106057844 A | 10/2016 |
| CN | 107221550 A | 9/2017 |
| CN | 107731866 A | 2/2018 |
| CN | 108461531 A | 8/2018 |
| CN | 109524441 A | 3/2019 |
| TW | 201637194 A | 10/2016 |

\* cited by examiner

OLED DISPLAY SUBSTRATE AND DISPLAY PANEL

CROSS REFERENCE TO RELATED APPLICATIONS

This is a National Phase Application filed under 35 U.S.C. 371 as a national stage of PCT/CN2019/119919, filed Nov. 21, 2019, an application claiming the benefit of Chinese Application No. 201811398515.6, filed Nov. 22, 2018, the content of each of which is hereby incorporated by reference in its entirety.

TECHNICAL FIELD

The present disclosure relates to the field of display technologies, and in particular, to an OLED display substrate and a display panel.

BACKGROUND

In recent years, with rapid development of organic light emitting diode (OLED) display technologies and their wide applications in the field of display technologies, display panels that are bendable, foldable, stretchable, etc. have been developed one after another. It is desirable to provide an OLED display substrate and a display panel that have improved display effects.

SUMMARY

An aspect of the present disclosure provides an OLED display substrate, which includes:

a plurality of display regions and a spacer region separating the plurality of display regions from each other, each of the plurality of display regions having a plurality of pixel units disposed therein, and each of the plurality of pixel units including a plurality of OLED devices respectively emitting light of different colors;

a first cathode connection line and an insulating layer that are disposed in at least one display region of the plurality of display regions and sequentially disposed between a base substrate and the plurality of OLED devices, wherein cathodes of all OLED devices located in a same display region of the plurality of display regions have a one-piece structure;

a via hole arranged in the insulating layer, wherein the cathodes of all OLED devices located in the same display region are connected to the first cathode connection line through the via hole; and a second cathode connection line disposed in the spacer region and connected to the first cathode connection line.

In some embodiment, the OLED display substrate further includes a connection electrode disposed in the via hole of the insulating layer, wherein two ends of the connection electrode are respectively connected to the first cathode connection line and the cathodes of all OLED devices located in the same display region.

In some embodiment, an anode of each OLED device is closer to the base substrate than the cathode of the OLED device, and the connection electrode and the anode of the OLED device are arranged in a same layer and include a same material.

In some embodiment, the OLED display substrate further includes a thin film transistor disposed on a side of the insulating layer proximal to the base substrate.

In some embodiment, the first cathode connection line and source and drain electrodes of the thin film transistor are disposed in a same layer and include a same material.

In some embodiment, the first cathode connection line and the second cathode connection line are disposed in a same layer and include a same material.

In some embodiment, the OLED display substrate further includes a thin film encapsulation layer, wherein an orthographic projection of each of the plurality of display regions on the base substrate falls within an orthographic projection of the thin film encapsulation layer on the base substrate.

In some embodiment, each of the plurality of display regions has a shape of an axisymmetric pattern, the plurality of pixel units in each of the plurality of display regions are uniformly arranged around a center of the display region, and an orthographic projection of the via hole of the insulating layer on the base substrate overlaps an orthographic projection of the center of the display region on the base substrate.

In some embodiment, the axisymmetric pattern includes a cross shape or a regular polygon.

In some embodiment, the first cathode connection line extends towards an outside of the display region where the first cathode connection line is located and extends beyond the display region, so as to be connected to the second cathode connection line.

In some embodiment, each of the first cathode connection line and the second cathode connection line includes a stretchable conductive material.

In some embodiment, the stretchable conductive material includes at least one of a metal, a conductive rubber, and graphene.

In some embodiment, the metal includes at least one of titanium, aluminum, silver, and copper.

In some embodiment, the second cathode connection line has a curved shape.

In some embodiment, the curved shape includes at least one of an S-shape, a zigzag shape, and a spiral shape.

In some embodiment, the base substrate includes a stretchable material or a bendable material.

In some embodiment, the base substrate includes at least one of polydimethylsiloxane, polyimide, and polyethylene terephthalate.

In some embodiment, the OLED display substrate further includes a barrier layer, wherein the barrier layer and thin film encapsulation layer isolate each OLED device of the plurality of display regions from an external environment.

In some embodiment, the via hole is disposed in a central region of the insulating layer corresponding to a center of the display region where the first cathode connection line is located.

Another aspect of the present disclosure provides a display panel, which includes the OLED display substrate according to any one of the foregoing embodiments of the present disclosure.

DETAILED DESCRIPTION

To enable one of ordinary skill in the art to better understand technical solutions of the present disclosure, the present disclosure will be further described in detail below with reference to the accompanying drawings and exemplary embodiments.

The inventors of the present inventive concept have found that, a related stretchable display panel includes a plurality of display regions and a spacer region separating the plurality of display regions from each other. Structures such as a thin film transistor (TFT), an insulating layer, an OLED device, a planarization layer, a thin film encapsulation layer, and the like are provided in each of the display regions of a substrate of the display panel. A cathode connection region is arranged at an edge of each of the display regions, and a stretchable cathode connection line is arranged in the spacer region. A cathode of the OLED device is connected to the cathode connection line in the spacer region through a via hole in the cathode connection region, such that a stretchability of the display panel is realized through the stretchable cathode connection line in the spacer region. Since the cathode connection region may have a width of 50 µm to 90 µm, a gap between two display regions in the display panel in the related art may be greater than 100 µm, and thus the display panel has a poor display effect.

Figure 1:
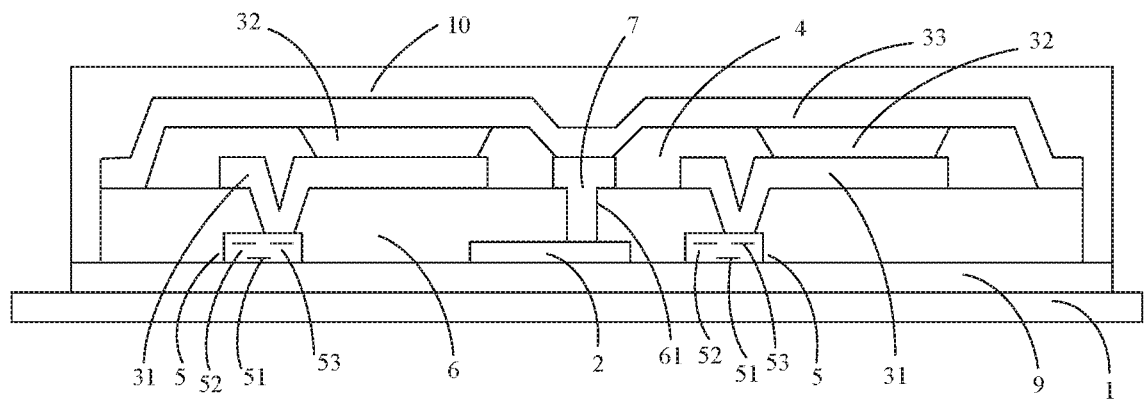
FIG. 1 is a schematic cross-sectional view showing a structure of a display substrate according to an embodiment of the present disclosure.
Figure 2:
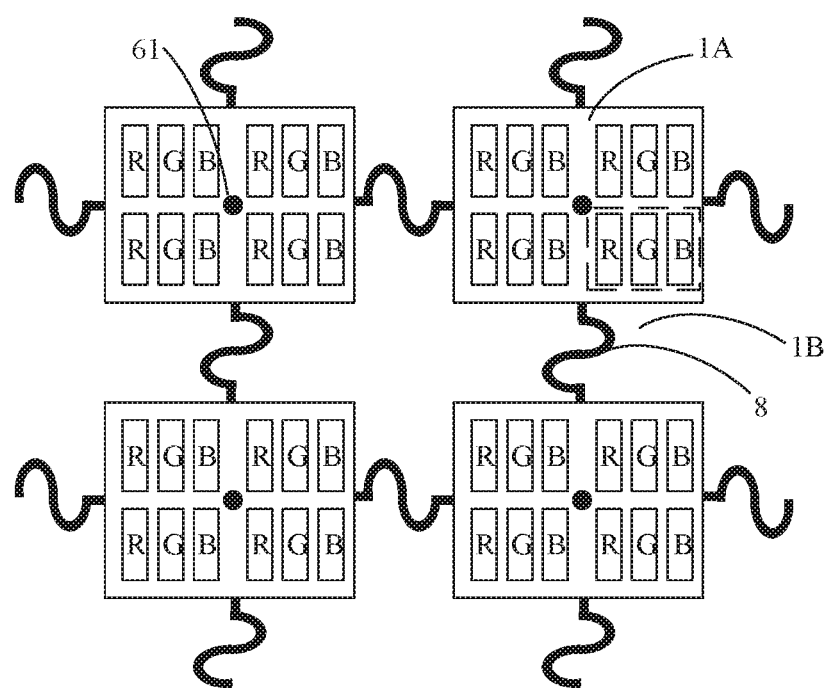
FIG. 2 is a schematic plan view showing a portion of a structure of a display substrate according to an embodiment of the present disclosure.

As shown in FIGS. 1 and 2, an embodiment of the present disclosure provides an OLED display substrate, which may be a stretchable OLED display substrate. The OLED display substrate includes a plurality of display regions 1A (the plurality of display regions 1A may be collectively referred to as a "display portion") and a spacer region 1B separating the plurality of display regions 1A from each other. Each of the display regions 1A may be a rigid region (i.e., a non-stretchable region) in which a plurality of pixel units are disposed. The spacer regions 1B may be an elastic region (e.g., a region that is stretchable and bendable), in which stretchable second cathode connection lines 8 are disposed, and each of the second cathode connection lines 8 connects different display regions 1A to each other. When the OLED display substrate is stretched, most of a stretching force applied to the OLED display substrate is released in the spacer region 1B, such that a crack does not easily occur in the structure of each of the display regions 1A. Therefore, an influence on an OLED device in each of the display regions 1A is reduced or avoided as much as possible, and a stretch resistance of the OLED display substrate is further improved.

For example, a shape of each of the display regions 1A may be an axisymmetric pattern, and for example, in FIG. 2, a symmetry axis of each of the display regions 1A may be a horizontal straight line or a vertical straight line passing through a center (e.g., a geometric center) of the display region 1A. In each of the display regions 1A, a plurality of pixel units may be uniformly arranged around the center of the display region 1A. In the present embodiment, an example in which the shape of each of the display regions 1A is a rectangle (e.g., a square) is illustrated.

Figure 5:
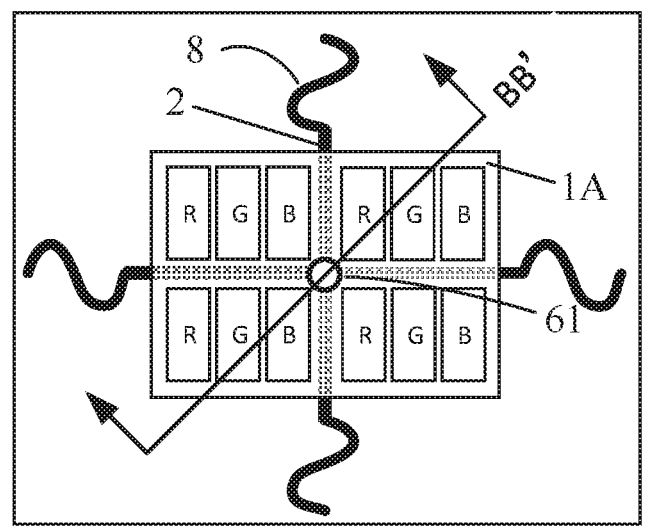
FIG. 5 is a schematic perspective view showing a structure of one display region of a display substrate according to an embodiment of the present disclosure.

It should be understood that, FIG. 1 may be a sectional view of each of the display regions 1A taken along a line BB' as shown in FIG. 5. As shown in FIGS. 1 and 2, in each display region 1A having a rectangular shape, a plurality of pixel units may be uniformly arranged in an array, each of the plurality of pixel units may include a plurality of sub-pixels, and each of the plurality of sub-pixels may include an OLED device and a thin film transistor 5 connected to the OLED device. The OLED devices of different sub-pixels in a same pixel unit may emit light of different colors. For example, the same pixel unit may include a red sub-pixel (R), a green sub-pixel (G), and a blue sub-pixel (B) which emit red light, green light, and blue light, respectively, to realize color display. For example, the cathodes 33 of a plurality of OLED devices located in a same display region 1A may have a one-piece structure and be formed of a same material. For example, in the OLED display substrate according to the present embodiment, the plurality of OLED devices in the plurality of pixel units may be arranged in a same direction, for example, all of the plurality of OLED devices in the pixel units may be arranged in a row direction (e.g., a horizontal direction in FIG. 2).

In this embodiment, in at least one display region 1A of the OLED display substrate, a first cathode connection line 2, an insulating layer (or planarization layer) 6, and an OLED device are sequentially disposed on a base substrate 1 along a direction away from the base substrate 1. As another embodiment, in each of the display regions 1A of the OLED display substrate, the first cathode connection line 2, the insulating layer (or planarization layer) 6, and the OLED device are sequentially disposed on the base substrate 1 in the direction away from the base substrate 1. A via hole 61 is provided in a central region of the insulating layer 6 corresponding to a center of a corresponding display region 1A, i.e., the central region may be a position of an orthographic projection of the center (e.g., a geometric center) of the corresponding display region 1A on the insulating layer 6. In other words, an orthographic projection of the via hole 61 of the insulating layer 6 on the base substrate 1 and an orthographic projection of the center of the corresponding display region 1A on the base substrate 1 may overlap each other. In another embodiment, the via hole 61 is disposed in the central region of the insulating layer 6 corresponding to the center of the display region 1A where the first cathode connection line 2 is disposed.

A cathode 33 of the OLED device is connected to the first cathode connection line 2 through the via hole 61, and the first cathode connection line 2 is connected to a second cathode connection line 8 in the spacer region 1B. For example, the first cathode connection line 2 may extend beyond the display region 1A where the first cathode connection line 2 is located to the outside of the display region 1A to be connected to the second cathode connection line 8, as shown in FIG. 5.

In an example, as shown in FIG. 1, each OLED device may be defined by a pixel definition layer 4. Each OLED device is arranged on a side of the thin film transistor 5 distal to the base substrate 1 and includes an anode 31, an organic light emitting layer 32 and a cathode 33 arranged in this order from bottom to top. The insulating layer 6 may be disposed between each thin film transistor 5 and each OLED device. The thin film transistor 5 is located on the side of the insulating layer 6 proximal to the base substrate 1, and each OLED device is located on a side of the insulating layer 6 distal to the base substrate 1. The thin film transistor 5 may include a gate electrode 51, a source electrode 52 and a drain electrode 53. The anode 31 of each OLED device is connected to the drain electrode 53 of the thin film transistor 5 by a via hole that penetrates through the insulating layer 6

(e.g., a via hole located on the left or right of the via hole 61 in FIG. 1). Further, the pixel definition layer 4 and the insulating layer 6 are provided with the via hole 61 in the central region of each display region 1A, and a diameter of the via hole 61 may range from 50 μm to 90 μm. The cathode 33 of each OLED device is connected to the first cathode connection line 2 located under the insulating layer 6 through the via hole 61, and the first cathode connection line 2 extends to the spacer region 1B to be connected to a corresponding second cathode connection line 8. Thus, a control electrical signal may be input to the cathode 33 of the OLED device of each display region 1A through the second cathode connection line 8.

With respect to the related art where a connection region for the cathode 33 is provided at an edge of each display region (e.g., each display region 1A), in the display substrate according to the present embodiment, by disposing the via hole 61 that connects the cathode 33 of the OLED device of each display region 1A and the corresponding first cathode connection line 2 to each other in the central region of the display region 1A (e.g., the via hole may be disposed between adjacent OLED devices located in the central region of each display region 1A), it is not necessary to additionally provide a connection region for the cathode 33 at an edge of each display region 1A. Therefore, a size of the edge of each display region 1A can be reduced, i.e., an area of the region (i.e., the spacer region 1B) other than the display regions 1A in the display substrate can be significantly reduced, thereby increasing an aperture ratio of the OLED display substrate and improving the display effect of the OLED display substrate.

As shown in FIG. 1, both the first cathode connection line 2 and the thin film transistor 5 may be located on the side of the insulating layer 6 proximal to the base substrate 1. For example, the first cathode connection line 2 and the source electrode 52 and the drain electrode 53 of the thin film transistor 5 may be disposed in a same layer and made of a same material, i.e., these three components may be formed by a one-step patterning process, so as to simplify a manufacturing process of the OLED display substrate and avoid increasing a thickness of the OLED display substrate.

Alternatively, the first cathode connection line 2 may be separately formed. Alternatively, as another exemplary embodiment, each first cathode connection line 2 and a corresponding second cathode connection line 8 may also be disposed in a same layer and made of a same material, i.e., each first cathode connection line 2 and the corresponding second cathode connection line 8 may formed by a one-step patterning process. In this case, each of each first cathode connection line 2 and the corresponding second cathode connection line 8 may be made of a metal having a good stretching capacity, such as titanium (Ti), aluminum (Al), silver (Ag), copper (Au), or the like, or may be made of a stretchable conductive material, such as conductive rubber, graphene, or the like.

In the OLED display substrate according to the present embodiment, a distance between a layer where the cathode 33 is located and a layer where the first cathode connection line 2 is located may be large, the thin film transistor 5 includes a plurality of layers, and a thickness of the insulating layer 6 may also be large. Thus, the via hole 61 in the insulating layer 6 may have a large depth, and the cathode 33 of each OLED device is typically formed by magnetron sputtering, vapor deposition, or the like. If a material of the cathode 33 is filled in the via hole 61 to connect the cathode 33 to the first cathode connection line 2, such that the effect of connecting the cathode 33 of the OLED device to the first cathode connection line 2 through the via hole 61 may be poor. Therefore, for example, in the present embodiment, a connection electrode 7 is separately disposed in the via hole of the insulating layer 6, and two ends of the connection electrode 7 are respectively connected to the first cathode connection line 2 and the cathodes of all OLED devices located in a same one of the display regions 1A. That is, as shown in FIG. 1, the via hole 61 is formed at a central position of the insulating layer 6 corresponding to the center of each display region 1A, and then the connection electrode 7 is formed in the via hole 61 by using a conductive material (e.g., a conductive metal) such that the connection electrode 7 is connected to the first cathode connection line 2 through the via hole 61. Thereafter, when a cathode 33 is formed, the cathode 33 is formed to be connected to the connection electrode 7, thereby ensuring that the effect of connecting the cathode 33 to the first cathode connection line 2 is good. It should be noted that, the via hole 61 may penetrate through the pixel definition layer 4 and the insulating layer 6.

For example, the connection electrode 7 and the anode 31 of each OLED device may be disposed in a same layer and made of a same material, i.e., the connection electrode 7 may be formed at the same time as the anode 31 is formed, so as to simplify the manufacturing process of the OLED display substrate.

For example, the OLED display substrate may further includes a thin film encapsulation layer 10, such that an orthographic projection of each of the plurality of display regions 1A on the base substrate 1 falls within an orthographic projection of the thin film encapsulation layer 10 on the base substrate 1. That is, as shown in FIG. 1, each display region 1A is individually encapsulated by the thin film encapsulation layer 10 and a barrier layer 9 described below, so as to prevent each OLED device in each display region 1A from being corroded by external water and oxygen as much as possible. For example, the thin film encapsulation layer 10 may be a single inorganic encapsulation layer or a stack of an inorganic encapsulation layer and an organic encapsulation layer, and may have a structure matching to a structure of each display region 1A to accommodate the display region 1A in the thin film encapsulation layer 10.

As described above, the display substrate may further be provided with the barrier layer 9, and a shape of the barrier layer 9 corresponds to (e.g., is similar to) a shape of an orthographic projection of each display region 1A on the base substrate 1. The barrier layer 9 and the thin film encapsulation layer 10 may together form a sealed space accommodating each display region 1A therein to enhance the encapsulation effect for each OLED device.

Figure 3:
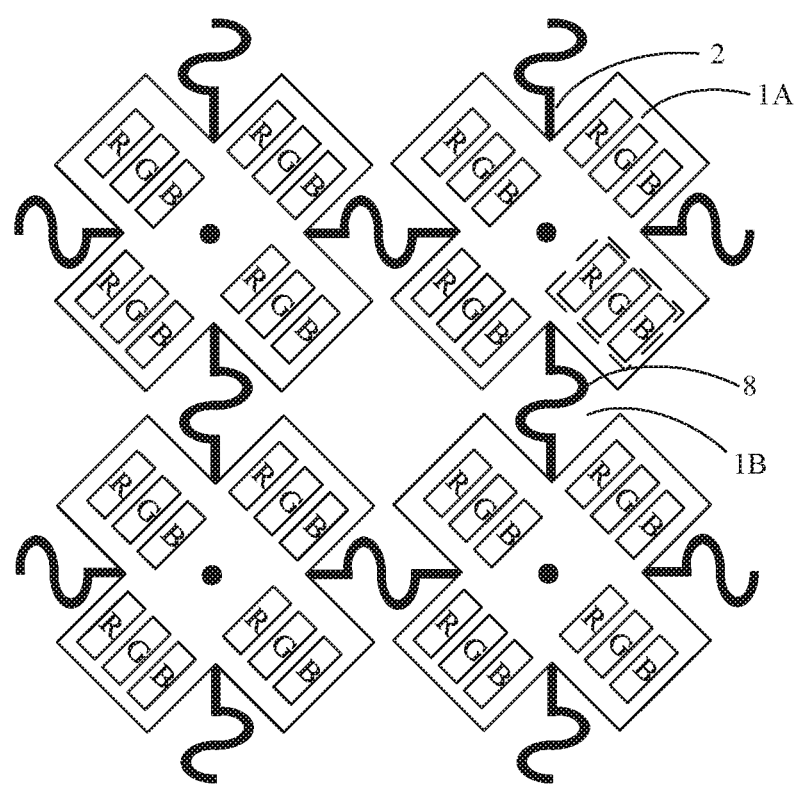
FIG. 3 is a schematic plan view showing a portion of a structure of another display substrate according to an embodiment of the present disclosure.

As shown in FIGS. 1 and 3, an embodiment of the present disclosure provides an OLED display substrate having substantially the same structure as the OLED display substrate according to the embodiment corresponding to FIGS. 1 and 2. The difference therebetween is that, in the OLED display substrate according to the present embodiment, each of the display regions 1A has a cross shape.

For example, as shown in FIG. 3, the display portion of the OLED display substrate may have a cross shape, four protrusion portions of the cross-shaped display portion are four display regions 1A, respectively, and one or more pixel units are disposed in each of the display regions 1A. In a same pixel unit, the OLED devices in different sub-pixels emit light of different colors. For example, the different sub-pixels may include three kinds of red sub-pixels, green sub-pixels, and blue sub-pixels, and the cathodes 33 of the plurality of OLED devices located in a same display region 1A have a one-piece structure. For example, a pattern formed by all of the cathodes 33 of the sub-pixels of the plurality of OLED devices located in a same display region 1A may be a cross-shaped pattern corresponding to the display region 1A. A via hole 61 is provided in the pixel definition layer 4 and the insulating layer 6 at a central region corresponding to a center of each display region 1A having the cross shape (e.g., a center symmetrical position of the cross-shaped pattern), and the cathode 33 is connected to the first cathode connection line 2 through the via hole 61.

Further, in the OLED display substrate according to the present embodiment, the plurality of OLED devices in the plurality of pixel units may be arranged in a same direction, and for example, as shown in FIG. 3, the plurality of OLED devices in each pixel unit may be arranged in a line connecting two opposite protrusion portions of the cross-shaped pattern (i.e., a direction forming an angle of 45° with the vertical direction in FIG. 3, i.e., a direction from the upper left to the lower right).

For example, two first cathode connection lines 2 perpendicularly crossing each other may be provided in each display region 1A (as shown in FIG. 3), to uniformly divide the display region 1A having the cross shape into four portions. Further, an intersection point of the two first cathode connection lines 2 corresponds to the via hole 61 at the central region of each display region 1A (e.g., an orthographic projection of the intersection point of the two first cathode connection lines 2 on the base substrate 1 and an orthographic projection of the via hole 61 at the central region of each display region 1A on the base substrate 1 overlap each other), and both ends of each first cathode connection line 2 are respectively connected to adjacent second cathode connection lines 8 in the spacer region 1B. For example, each cathode 33 may be connected to the first cathode connection line 2 through the connection electrode 7 disposed in the via hole, which may be referred to the foregoing detailed description of the embodiment corresponding to FIGS. 1 and 2, and is not described in detail here.

Figure 4:
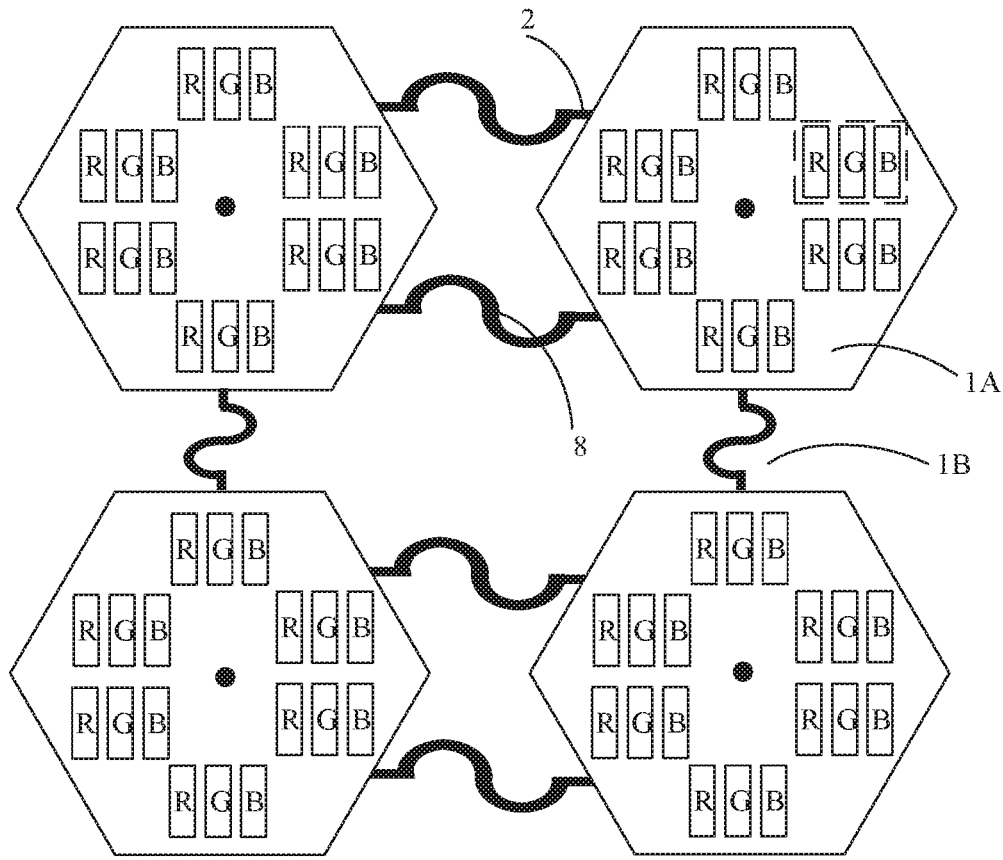
FIG. 4 is a schematic plan view showing a portion of a structure of still another display substrate according to an embodiment of the present disclosure.

As shown in FIGS. 1 and 4, an embodiment of the present disclosure provides an OLED display substrate, which is substantially the same as the OLED display substrate according to the embodiment corresponding to FIGS. 1 and 2. The difference therebetween is that, in the OLED display substrate according to the present embodiment, each of the display regions 1A has a shape of regular polygon. Hereinafter, the OLED display substrate according to the present embodiment will be described by taking an example in which the shape of each display region 1A is a hexagon.

As shown in FIG. 4, each of the display regions 1A of the OLED display substrate is a regular hexagon, and each display region 1A may be divided into six portions by using a line connecting a midpoint of each side of each display region 1A and a center of the display region 1A as a boundary. One first cathode connection line 2 may be disposed right below the boundary between any two adjacent portions, and two ends of each first cathode connection line 2 may be respectively connected to two second cathode connection lines 8 located in the spacer region 1B. One or more pixel units may be disposed in each display region 1A, the OLED devices in different sub-pixels in a same pixel unit emit light of different colors (e.g., the different sub-pixels may include three types of red sub-pixels, green sub-pixels, and blue sub-pixels), and the cathodes 33 of the plurality of OLED devices in the same display region 1A have a one-piece structure. For example, the overall pattern formed by the cathodes 33 of the plurality of sub-pixels located in the same display region 1A may be a regular hexagonal pattern corresponding to the shape of the display region 1A. A via hole 61 is provided in a central region of the pixel definition layer 4 and the insulating layer 6 corresponding to a center of each display region 1A of the regular hexagon (e.g., the center symmetrical position of the hexagonal pattern), and the cathode 33 is connected to the first cathode connection line 2 through the via hole 61.

In addition, in the OLED display substrate according to the present embodiment, the plurality of OLED devices in the plurality of pixel units may be arranged in a same direction, and for example, as shown in FIG. 4, the plurality of OLED devices in each pixel unit may be arranged in a direction connecting two opposite vertices of the regular hexagonal pattern (e.g., the horizontal direction in FIG. 4).

As described above, a plurality of first cathode connection lines 2 may be disposed in each display region 1A (only one end of each first cathode connection line 2 is seen in FIG. 4, and the rest of the first cathode connection line 2 are shielded by the layers disposed thereon). As described above, each first cathode connection line 2 may be located right below a line connecting a midpoint of one side of a corresponding display region 1A and a center of the corresponding display region 1A, and may intersect an orthographic projection of the center of the corresponding display region 1A on a plane in which the first cathode connection line 2 is located. Each first cathode connection line 2 may be connected to the cathodes 33 of the OLED devices through the via hole 61 in the central region of the regular hexagonal display region 1A. Further, both ends of each first cathode connection line 2 are respectively connected to adjacent second cathode connection lines 8 in the spacer region 1B. For example, each cathode 33 may be connected to the first cathode connection line 2 through the connection electrode 7 disposed in the via hole 61. Detailed description of other structural features may be referred to the foregoing description of the embodiment corresponding to FIGS. 1 and 2, and are not repeated here.

In some embodiments, as shown in FIGS. 2 to 4, each of the second cathode connection lines 8 may have a curved shape to provide a buffer for the stretching and/or bending of the OLED display substrate. For example, the curved shape may include at least one of an S-shape, a zigzag shape, and a spiral shape.

In some embodiments, the base substrate 1 of the OLED display substrate may be made of a stretchable material or a bendable material such that the OLED display substrate is stretchable and/or bendable. For example, the stretchable or bendable material may include at least one of polydimethylsiloxane (PDMS), polyimide (PI), and polyethylene terephthalate (PET).

In some embodiments, each of the barrier layer 9 and the thin film encapsulation layer 10 may be made of a transparent material (e.g., glass).

An embodiment of the present disclosure provides a display panel including the OLED display substrate according to any one of the embodiment corresponding to FIGS. 1 and 2, the embodiment corresponding to FIGS. 1 and 3, and the embodiment corresponding to FIGS. 1 and 4. The display panel according to the present embodiment is a stretchable OLED display panel, which may be applied to any product or component with a display function, such as a mobile phone, a tablet computer, a television, a display, a notebook computer, an advertising panel.

Since the display panel according to the present embodiment includes the OLED display substrate provided by any one of the foregoing embodiments of the present disclosure, the display panel has a high aperture ratio and an excellent display effect.

It should be understood that the foregoing embodiments are merely exemplary embodiments for explaining the principle of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. An organic light-emitting diode (OLED) display substrate, comprising: a plurality of display regions and a spacer region separating the plurality of display regions from each other, each of the plurality of display regions having a plurality of pixel units therein, and each of the plurality of pixel units comprising a plurality of OLED devices respectively emitting light of different colors; a first cathode connection line and an insulating layer that are in at least one display region of the plurality of display regions and sequentially between a base substrate and the plurality of OLED devices, wherein cathodes of all OLED devices in a same display region of the plurality of display regions have a one-piece structure; a via hole in the insulating layer, wherein the cathodes of all OLED devices in the same display region are connected to the first cathode connection line through the via hole; and a second cathode connection line in the spacer region and connected to the first cathode connection line.

2. The OLED display substrate according to claim 1, further comprising a connection electrode in the via hole of the insulating layer, wherein two ends of the connection electrode are respectively connected to the first cathode connection line and the cathodes of all OLED devices located in the same display region.

3. The OLED display substrate according to claim 2, wherein an anode of each OLED device is closer to the base substrate than the cathode of the OLED device, and the connection electrode and the anode of the OLED device are in a same layer and comprise a same material.

4. The OLED display substrate according to claim 1, further comprising a thin film transistor on a side of the insulating layer proximal to the base substrate.

5. The OLED display substrate according to claim 4, wherein the first cathode connection line and source and drain electrodes of the thin film transistor are in a same layer and comprise a same material.

6. The OLED display substrate according to claim 1, wherein the first cathode connection line and the second cathode connection line are in a same layer and comprise a same material.

7. The OLED display substrate according to claim 1, further comprising a thin film encapsulation layer, wherein an orthographic projection of each of the plurality of display regions on the base substrate falls within an orthographic projection of the thin film encapsulation layer on the base substrate.

8. The OLED display substrate according to claim 7, further comprising a barrier layer, wherein the barrier layer and the thin film encapsulation layer isolate each OLED device of the plurality of display regions from an external environment.

9. The OLED display substrate according to claim 1, wherein each of the plurality of display regions has a shape of an axisymmetric pattern, the plurality of pixel units in each of the plurality of display regions are uniformly around a center of the display region, and an orthographic projection of the via hole of the insulating layer on the base substrate overlaps an orthographic projection of the center of the display region on the base substrate.

10. The OLED display substrate according to claim 9, wherein the axisymmetric pattern comprises a cross shape or a regular polygon.

11. The OLED display substrate according to claim 1, wherein the first cathode connection line extends towards an outside of the display region where the first cathode connection line is located and extends beyond the display region, so as to be connected to the second cathode connection line.

12. The OLED display substrate according to claim 1, wherein each of the first cathode connection line and the second cathode connection line comprises a stretchable conductive material.

13. The OLED display substrate according to claim 12, wherein the stretchable conductive material comprises at least one of a metal, a conductive rubber, and graphene.

14. The OLED display substrate according to claim 13, wherein the metal comprises at least one of titanium, aluminum, silver, and copper.

15. The OLED display substrate according to claim 1, wherein the second cathode connection line has a curved shape.

16. The OLED display substrate according to claim 15, wherein the curved shape comprises at least one of an S-shape, a zigzag shape, and a spiral shape.

17. The OLED display substrate according to claim 1, wherein the base substrate comprises a stretchable material or a bendable material.

18. The OLED display substrate according to claim 17, wherein the base substrate comprises at least one of polydimethylsiloxane, polyimide, and polyethylene terephthalate.

19. The OLED display substrate according to claim 1, wherein the via hole is in a central region of the insulating layer corresponding to a center of the display region where the first cathode connection line is located.

20. A display panel, comprising the OLED display substrate according to claim 1.

* * * * *